United States Patent
Song et al.

(10) Patent No.: US 7,898,167 B2
(45) Date of Patent: Mar. 1, 2011

(54) ELECTROLUMINESCENCE DISPLAY DEVICE WITH IMPROVED EXTERNAL LIGHT COUPLING EFFICIENCY AND BRIGHTNESS

(75) Inventors: Young-Woo Song, Suwon-si (KR); Yoon-Chang Kim, Suwon-si (KR); Sang-Hwan Cho, Suwon-si (KR); Ji-Hoon Ahn, Suwon-si (KR); Joon-Gu Lee, Suwon-si (KR); So-Young Lee, Suwon-si (KR); Jong-Seok Oh, Suwon-si (KR); Jae-Heung Ha, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 456 days.

(21) Appl. No.: 11/298,569

(22) Filed: Dec. 12, 2005

(65) Prior Publication Data
US 2006/0125389 A1 Jun. 15, 2006

(30) Foreign Application Priority Data
Dec. 13, 2004 (KR) ................ 10-2004-0104943

(51) Int. Cl.
*H01J 51/00* (2006.01)
*H01J 51/52* (2006.01)
*G02B 1/10* (2006.01)

(52) U.S. Cl. ............... 313/501; 313/506; 313/509; 359/247; 359/285; 359/586

(58) Field of Classification Search ......... 313/498–512; 359/247, 285, 286
See application file for complete search history.

(56) References Cited

U.S. PATENT DOCUMENTS

| | | | |
|---|---|---|---|
| 6,111,361 A * | 8/2000 | Xu et al. | 315/169.1 |
| 6,285,039 B1 * | 9/2001 | Kobori et al. | 257/40 |
| 6,888,305 B2 * | 5/2005 | Weaver | 313/506 |
| 7,230,374 B2 * | 6/2007 | Suh et al. | 313/504 |
| 7,339,315 B2 * | 3/2008 | Suh et al. | 313/501 |
| 7,531,958 B2 * | 5/2009 | Nishikawa et al. | 313/504 |
| 2001/0026127 A1 * | 10/2001 | Yoneda et al. | 313/506 |
| 2002/0094422 A1 * | 7/2002 | Tsai et al. | 428/210 |
| 2003/0039813 A1 * | 2/2003 | Kitai et al. | 428/212 |
| 2003/0062520 A1 * | 4/2003 | Toguchi et al. | 257/40 |
| 2003/0085652 A1 * | 5/2003 | Weaver | 313/506 |

(Continued)

FOREIGN PATENT DOCUMENTS

EP 1 124 261 A1 8/2001

(Continued)

*Primary Examiner*—Sikha Roy
*Assistant Examiner*—Jose M Diaz
(74) *Attorney, Agent, or Firm*—H.C. Park & Associates, PLC

(57) ABSTRACT

An electroluminescence (EL) display device with improved external light coupling efficiency and brightness that may be easily manufactured. The EL display device includes: a substrate; a first electrode arranged above the substrate; a second electrode arranged above and substantially parallel to the first electrode; an intermediate layer arranged between the first and second electrodes, and including an emissive layer; a color converting layer arranged between the substrate and the first electrode or above the second electrode; and a light resonance controlling layer arranged between the emissive layer and the color converting layer.

21 Claims, 5 Drawing Sheets

U.S. PATENT DOCUMENTS

| | | | |
|---|---|---|---|
| 2003/0230972 A1* | 12/2003 | Cok | 313/504 |
| 2004/0027055 A1* | 2/2004 | Yamazaki et al. | 313/498 |
| 2004/0051445 A1* | 3/2004 | Adachi | 313/504 |
| 2004/0080267 A1* | 4/2004 | Cok | 313/512 |
| 2004/0155576 A1* | 8/2004 | Tyan et al. | 313/504 |
| 2004/0160171 A1* | 8/2004 | Takahashi | 313/504 |
| 2004/0164671 A1* | 8/2004 | Noguchi | 313/504 |
| 2004/0227458 A1* | 11/2004 | He et al. | 313/504 |
| 2005/0007014 A1* | 1/2005 | Kurata | 313/504 |
| 2005/0017649 A1* | 1/2005 | Tanabe | 315/169.2 |
| 2005/0067945 A1* | 3/2005 | Nishikawa et al. | 313/501 |
| 2005/0073228 A1* | 4/2005 | Tyan et al. | 313/110 |
| 2005/0073230 A1* | 4/2005 | Nishikawa et al. | 313/111 |
| 2005/0093434 A1* | 5/2005 | Suh et al. | 313/504 |
| 2005/0093435 A1* | 5/2005 | Suh et al. | 313/504 |
| 2005/0162077 A1* | 7/2005 | Park | 313/504 |
| 2005/0225233 A1* | 10/2005 | Boroson et al. | 313/504 |
| 2005/0275343 A1* | 12/2005 | Tanaka et al. | 313/504 |
| 2005/0285107 A1* | 12/2005 | Koo et al. | 257/59 |
| 2006/0202613 A1* | 9/2006 | Kawaguchi et al. | 313/506 |
| 2006/0263521 A1* | 11/2006 | Sato et al. | 427/248.1 |
| 2007/0194692 A1* | 8/2007 | Nomura et al. | 313/503 |
| 2007/0247066 A1* | 10/2007 | Tokairin et al. | 313/506 |

FOREIGN PATENT DOCUMENTS

| | | |
|---|---|---|
| EP | 1124261 A1 * | 8/2001 |
| JP | 4-192290 | 7/1992 |
| JP | 7-037688 | 2/1995 |
| JP | 10-172756 | 6/1998 |
| JP | 2002508108 | 3/2002 |
| JP | 1020030013700 | 2/2003 |
| JP | 2004031242 A * | 1/2004 |
| JP | 1020040048235 | 6/2004 |
| WO | 98/59528 | 12/1998 |
| WO | 00/04594 | 1/2000 |

* cited by examiner

ELECTROLUMINESCENCE DISPLAY DEVICE WITH IMPROVED EXTERNAL LIGHT COUPLING EFFICIENCY AND BRIGHTNESS

CROSS REFERENCE TO RELATED APPLICATION

This application claims the priority to and benefit of Korean Patent Application No. 10-2004-0104943, filed on Dec. 13, 2004, in the Korean Intellectual Property Office, which is hereby incorporated by reference for all purposes as if fully set forth herein.

BACKGROUND OF THE INVENTION

1. Field of the Invention

The present invention relates to an electroluminescence (EL) display device, and more particularly, to an EL display device with improved external light coupling efficiency and brightness that may be easily manufactured.

2. Discussion of the Background

The external light coupling efficiency, $\eta_{ex}$, of an EL display device is given by the following equation:

$$\eta_{ex} = \eta_{in} \cdot \eta_{out}$$

where, $\eta_{in}$ and $\eta_{out}$ denote the internal quantum coupling efficiency and the output quantum coupling efficiency, respectively. The internal quantum coupling efficiency, $\eta_{in}$, is determined by self-elimination within each layer. The output quantum coupling efficiency, $\eta_{out}$, is determined by the prevention of light to the outside due to the total internal reflection in each layer (i.e., failure to transmit the light to the outside due to the total internal reflection occurring at an interface because an incident angle of the light is greater than a critical angle of the light when the light is incident from a medium having a higher refractive index as compared to another medium having a lower refractive index). In the EL display device, a light emitting layer transmits the light through many layers before emitting the light to the outside, where variations in the refractive indexes of the many layers prevent emission of some light.

The output quantum coupling efficiency, $\eta_{out}$, or the light transmittance efficiency which depends on the total internal reflection at interfaces between the layers when the emissive layer emits light to the outside, may be expressed as:

$$\eta_{out} = \frac{1}{2}\left(\frac{N_{out}}{N_{in}}\right)^2 \quad (2)$$

where $N_{out}$ represents the refractive index of the emissive layer emitting the light, and $N_{in}$ represents the refractive index of the emissive layer receiving the light. For example, the output light coupling efficiency of light transmitting through a layer with a refractive index of about 1.5 to a layer with a refractive index of about 1.2 is determined to be 32% using Equation 2, or about 70% of the light which enters the interface is not emitted to the outside.

There have been many efforts to prevent lowered external light coupling efficiency.

Japanese Patent Publication No. 4-192290 discloses an inorganic EL device where a plurality of condensing microlenses is the same size or larger than an inorganic EL element. The plurality of condensing microlenses is formed on an external surface of a transparent substrate on which the inorganic EL element is formed. Light incident to the interface between the transparent substrate and air at an angle greater than the critical angle has an incident angle less than the critical angle on the microlenses, thereby reducing the total internal reflection. Additionally, the light is emitted in a predetermined direction to improve brightness. However, the cited invention discloses the EL element is a surface light source; thus, diffused light, which is not focused, inevitably occurs when using a microlens that is the same size or larger than the EL element. Clarity of an image is reduced due to overlapping images produced by the adjacent EL elements.

Japanese Patent Publication No. 7-037688 discloses an EL element formed on a substrate having a cylindrically-shaped high refraction factor section composed of a material having a higher refraction index than the surrounding material formed around the side surface of the substrate. Light produced by the EL element is emitted through the high-refraction factor section to increase external light coupling efficiency. However, in the cited invention, the light transmitted through the high-refraction factor section is diffused light, as illustrated in FIG. 1 of the cited invention. Thus, the brightness of the light emitted to the front is not improved.

Japanese Patent Publication No. 10-172756 discloses an organic EL light emitting device having a plurality of condensing lenses formed between a lower electrode, composing the organic EL light emitting device, and a transparent substrate. The organic EL light emitting device and the condensing lens are disposed in correspondence with one another. Light transmitted through the EL light emitting device is incident to an interface of the transparent substrate at a smaller angle than the critical angle for increasing the external light coupling efficiency. However, in the cited invention, overlapping images produced by adjacent EL light emitting devices reduce image clarity.

SUMMARY OF THE INVENTION

The present invention provides an electroluminescence (EL) display device with improved external light coupling efficiency and brightness that may be easily manufactured.

Additional features of the invention will be set forth in the description which follows, and in part will be apparent from the description, or may be learned by practice of the invention.

The present invention discloses an EL display device, including: a substrate; a first electrode arranged above the substrate; a second electrode arranged above and substantially parallel to the first electrode; an intermediate layer arranged between the first and second electrodes, and including an emissive layer; a color converting layer arranged between the substrate and the first electrode, or arranged above the second electrode; and a light resonance controlling layer arranged between the emissive layer and the color converting layer.

The present invention also discloses the emissive layer may emit blue light.

The present invention also discloses the color converting layer may convert light emitted from the emissive layer into one of red, green, and blue light.

The present invention also discloses the light resonance controlling layer may be a single layer.

The present invention also discloses a refractive index of the light resonance controlling layer may be lower than refractive indexes of layers arranged on the light resonance controlling layer and below the light resonance controlling layer.

The present invention also discloses the light resonance controlling layer may include at least two layers.

The present invention also discloses the light resonance controlling layer may include alternating layers having a low refractive index and layers having a high refractive index.

The present invention also discloses the color converting layer may be arranged between the substrate and the first electrode, and the light resonance controlling layer may be arranged between the color converting layer and the first electrode.

The present invention also discloses the color converting layer may be arranged above the second electrode, and the light resonance controlling layer may be arranged between the second electrode and the color converting layer.

The present invention also discloses the color converting layer may be arranged between the substrate and the first electrode and between the substrate and the second electrode, and the light resonance controlling layer may be arranged between the first electrode and the color converting layer arranged between the substrate and the first electrode, and arranged between the second electrode and a color converting layer arranged above the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention are incorporated in an constitute a part of this specification, illustrate embodiments of the invention, and together with the description serve to explain the principles of the invention.

Figure 1:
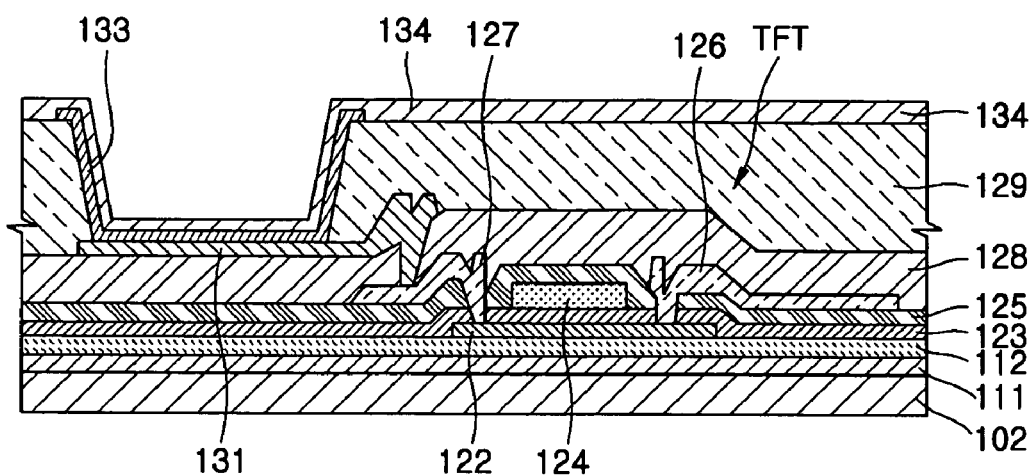
FIG. 1 is a schematic cross-sectional view of an electroluminescence (EL) display device according to a first embodiment of the present invention.

DETAILED DESCRIPTION OF THE
ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. In the drawings, like reference numerals denote like components.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

FIG. 1 is a schematic cross-sectional view of an electroluminescence (EL) display device according to a first embodiment of the present invention.

EL display devices are classified as passive matrix (PM) EL display devices with a simple matrix type or active matrix (AM) EL display devices including a thin film transistor (TFT) based on a method of controlling the emission of pixels. The EL display device in the present embodiment is an AM EL display device.

Referring to FIG. 1, a first electrode 131 is arranged above a substrate 102, a second electrode 134 substantially parallel to the first electrode 131 is arranged above the first electrode 131, and an intermediate layer 133 including an emissive layer is arranged between the first electrode 131 and the second electrode 134. At least one TFT is coupled to the first electrode 131, and a capacitor may be further coupled to the TFT, if required.

The substrate 102 may be made of transparent glass, but may also be made of acryl, polymide, polycarbonate, polyester, mylar, or other plastic materials. A buffer layer (not shown) made of $SiO_2$ may be further disposed on the substrate 102 to maintain a smooth surface of the substrate 102 and prevent impurities from penetrating into the substrate 102.

The first electrode 131 functions as an anode electrode and the second electrode 134 functions as a cathode electrode, or vice versa.

The EL display device of the present embodiment is a bottom emission EL display device in which light is emitted towards the substrate 102. Therefore, the first electrode 131 is a transparent electrode made of, for example, ITO, IZO, ZnO, or $In_2O_3$. The first electrode 131 may be disposed to correspond to sub-pixels. The second electrode 134 is a reflective electrode, and is made by depositing Li, Ca, LiF/Ca, LiF/Al, Al, or Mg, and compounds of Li, Ca, LiF/Ca, LiF/Al, Al, or Mg. The second electrode 134 may be disposed to correspond to each of the sub-pixels or may be disposed across the entire surface of the substrate 102. In other embodiments described below, the EL display device may be configured, as described above for the bottom emission EL display device or the EL display device may be structured in other ways.

As described above, the TFT is connected to the first electrode 131. The TFT includes a semiconductor layer 122, a gate insulating layer 123 arranged on the semiconductor layer 122, and a gate electrode 124 arranged on the gate insulating layer 123. The gate electrode 124 is connected to a gate line (not shown) which supplies an on/off signal for the TFT. A region on which the gate electrode 124 is arranged corresponds to a channel region of the semiconductor layer 122. The structure of the TFT is not limited to that illustrated in FIG. 1; various other structures of TFTs, such as an organic TFT, may be used.

An inter-insulator 125 is formed on the gate electrode 124, and a source electrode 126 is connected to a source region and a drain electrode 127 is connected a drain region of the semiconductor layer 122 via a contact hole.

A planarization layer or a protective layer 128 made of $SiO_2$ is formed on the source electrode 126 and the drain electrode 127, and a pixel defining layer 129 made of acryl, polymide, polycarbonate, polyester, mylar, or other plastic materials is formed on the planarization layer 128.

Also, although not illustrated in FIG. 1, at least one capacitor is connected to the TFT. A circuit including the TFT is not limited to that illustrated in FIG. 1 and may be embodied in various ways.

The drain electrode 127 is connected to an EL element. The first electrode 131, which functions as the anode electrode of the EL element, is arranged on the planarization layer 128; the pixel defining layer 129 is arranged on the planarization layer 128, and the intermediate layer 133 including the emissive layer is arranged in a predetermined opening arranged in the pixel defining layer 129. In FIG. 1, the intermediate layer 133 is patterned to correspond to only the sub-pixels; thus, the intermediate layer 133 may be integrated with an intermediate layer of an adjacent sub-pixel.

The intermediate layer 133 may be composed of an organic or inorganic material. If the intermediate layer 133 is composed of an organic material, the organic material may be a high molecular weight organic material or a low molecular weight organic material. When the low molecular weight organic material is used, a hole injection layer (HIL), a hole transport layer (HTL), an emissive layer (EML), an electron transport layer (ETL), and an electron injection layer (EIL) may be stacked in a single structure or in multiple structures, where the organic material may be copper phthalocyanine (CuPc), N,N'-di(naphthalene-1-yl)-N,N'-diphenyl-benzidine (NPB), tris-8-hydroxyquinoline aluminum (Alq3), or the like. The low molecular weight organic material is provided in a pattern, as described above, and is formed using a vacuum deposition method using masks, such as those described above.

When the high molecular weight organic material is used, the intermediate layer 133 may include an HTL and an EML. The HTL may be made of poly-3,4-ethylenedioxythiophene (PEDOT) and the EML may be made of a high molecular weight organic material, for example, from the poly-phenylenevinylene (PPV) family and the polyfluorene family.

The structure and materials of the intermediate layer 133 may be applied to other embodiments described below, and variations of the intermediate layer 133 in the present embodiment may also be applied to other embodiments.

The EL element formed on the substrate 102 is covered by an element (not shown) substantially parallel to the EL element. The element may be made of glass or a plastic material similar to the material chosen for the substrate 102, but may also be made of a metal cap.

A color converting layer 111 is arranged between the substrate 102 and the first electrode 131 or above the second electrode 134. In the EL display device of the present embodiment, the color converting layer 111 is arranged between the substrate 102 and the first substrate 131, as illustrated in FIG. 1, and is a bottom emission EL display device, where light emitted from the emissive layer of the intermediate layer 133 is transmitted to the outside via the substrate 102.

A light resonance controlling layer 112 is arranged between the emissive layer included in the intermediate layer 133 and the color converting layer 111. In the case of the EL display device according to the present embodiment, the light resonance controlling layer 112 is arranged on a surface of the color converting layer 111 substantially parallel to the intermediate layer 133 including the emissive layer, as illustrated in FIG. 1. Various other layers are arranged between the emissive layer included in the intermediate layer 133 and the color converting layer 111, as illustrated in FIG. 1. Thus, the light resonance controlling layer 112 may be arranged between any two of the layers, as illustrated in the structure of FIG. 1.

This also applies to other embodiments described below.

The emissive layer included in the intermediate layer 133 is a light emitting layer which emits light of a single color, and the color converting layer 111 is a layer which converts the light emitted from the emissive layer into a color of light selected from the group consisting of red, green or blue light. The emissive layer included in the intermediate layer 133 may emit blue light. In this case, the color converting layer 111 may convert the blue light into red or green light or transmit the blue light without a color conversion.

The light resonance controlling layer 112 in the present embodiment is a single layer, where the refractive index of the light resonance controlling layer 112 is smaller than the refractive index of a layer arranged on a top surface of the light resonance controlling layer 112 and the refractive index of a layer formed on a bottom surface of the light resonance controlling layer 112. In the case of the EL display device of the present embodiment, the layer formed on the bottom surface of the light resonance controlling layer 112 is the color converting layer 111 and the layer formed on the top surface of the light resonance controlling layer 112 is the gate insulating layer 123. The light resonance controlling layer 112 may be arranged between different layers as described above.

In the structure described above, when the light emitted from the emissive layer included in the intermediate layer 133 undergoes constructive interference within the light resonance controlling layer 112, the strength of the light is increased. The amplified light is emitted to the outside via the color converting layer 111 and the substrate 102, thereby increasing external light coupling efficiency and brightness.

The refractive index of the color converting layer 111 and the refractive index of the gate insulating layer 123 are each about 1.5; thus, the light resonance controlling layer 112 is made of a material with a refractive index greater than 1.5. Accordingly, the light resonance controlling layer 112 may be made of a sol gel material in which $SiN_x$, $Nb_2O_5$, $Ta_2O_x$, or the like with high refractive particles are dispersed.

In the EL display device including the light resonance controlling layer 112, as described above, the emissive layer included in the intermediate layer 133 emits monochrome light—not red, green, and blue light. The EL display devices comprises a separate color converting layer 111 for converting the color of the light emitted from the emissive layer to facilitate the manufacturing of the EL display device.

For the EL display device, as described above, constructive interference occurs within the light resonance controlling layer 112 when the light within the light resonance controlling layer 112 is in phase, which may be achieved by controlling the thickness of the light resonance controlling layer 112. The thickness of the light resonance controlling layer 112 is determined by the wavelength of the light within the light resonance controlling layer 112. Therefore, the light within the light resonance controlling layer 112 should be single-wavelength light. Thus, if different colored light (i.e., light of different wavelengths) is emitted per sub-pixel, the thickness of the light resonance controlling layer 112 should be different for each of the sub-pixels, resulting in a complex manufacturing process characterized by increased costs and decreased production yield.

All of the sub-pixels in the EL display device of the present embodiment emit light of the same color (i.e., light of the same wavelength), the light thickness of the resonance controlling layer 112 is set so that the same wavelength light may be amplified, and the amplified light is transmitted through the light resonance controlling layer 112 to display a full color image. As a result, the manufacturing process of the EL display device according to the present invention may be simplified, manufacturing costs may be reduced, and the production yield of the EL display device may be improved.

The light resonance controlling layer 112 may be arranged in correspondence with each pixel or sub-pixel, or arranged over all of the pixels as a single layer.

Figure 2:
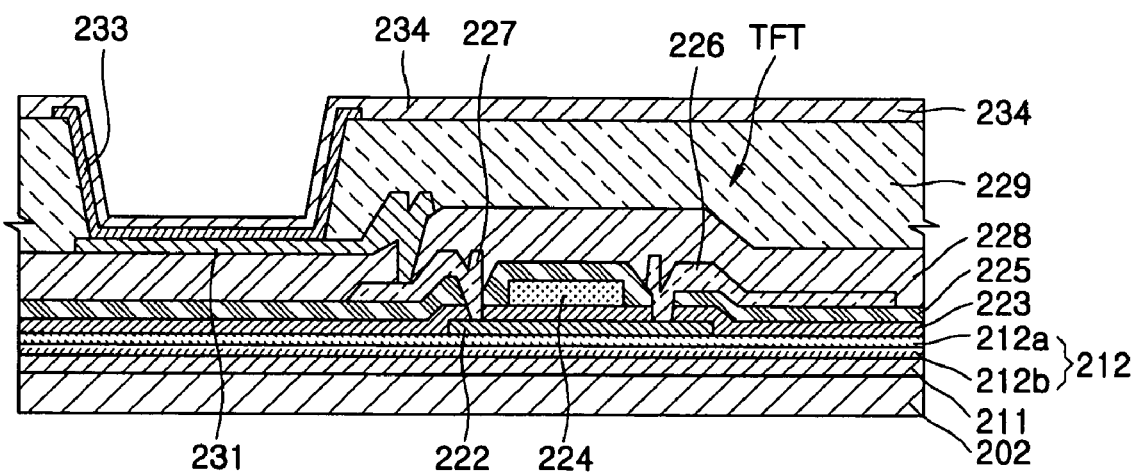
FIG. 2 is a schematic cross-sectional view of an EL display device according to a second embodiment of the present invention.

FIG. 2 is a schematic cross-sectional view of an active matrix EL display device according to a second embodiment of the present invention.

Referring to FIG. 2, a first electrode 231 is arranged above a substrate 202, a second electrode 234 facing the first electrode 231 is arranged above the first electrode 231, and an intermediate layer 233 including an emissive layer is arranged between the first electrode 231 and the second electrode 234. At least one TFT is connected to the first electrode 231, and a capacitor may be further coupled to the TFT if required. A buffer layer (not shown) made of, for example, $SiO_2$ may be arranged on the substrate 202 to maintain a smooth surface of the substrate 202 and to prevent penetration of impurities.

A color converting layer 211 is arranged between the substrate 202 and the first electrode 231, arranged on the second electrode 234, or both. In the present embodiment, the light converting layer 211 is arranged between the substrate 202 and the first electrode 231. The EL display device is a bottom emission EL display device in which light emitted from the emissive layer included in the intermediate layer 233 is emitted to the outside via the substrate 202.

A light resonance controlling layer 212 is arranged between the emissive layer included in the intermediate layer 233 and the color converting layer 211. In the EL display device of the present embodiment, the light resonance controlling layer 212 is arranged on and substantially parallel to the color converting layer 211 and the intermediate layer 233 including the emissive layer, as illustrated in FIG. 2. Many layers are formed between the emissive layer included in the intermediate layer 233 and the color converting layer 211, as illustrated in FIG. 2. The light resonance layer 212 may be arranged between any of the layers illustrated in the structure of FIG. 2.

The emissive layer included in the intermediate layer 233 is a light emitting layer which emits light of a single color, and the color converting layer 211 is a layer which converts the light emitted from the emissive layer into a color of light selected from the group consisting of red, green or blue light. The emissive layer included in the intermediate layer 233 may emit blue light. In this case, the color converting layer 211 may convert the blue light into red or green light or transmit the blue light without a color conversion.

The EL display device of the present embodiment differs from the EL display device of the first embodiment because the light resonance controlling layer 212 of the present embodiment is constructed in a multi-layered structure including two layers, an upper layer 212a and a lower layer 212b, and not in a single layered structure, as described in the first embodiment. Although FIG. 2 only illustrates two layers, upper layer 212a and lower layer 212b in the light resonance controlling layer 212, the light resonance controlling layer 212 may include more than two layers. The light resonance controlling layer 212 may include alternating a layer with a high refractive index and a layer with a low refractive index. If the light resonance controlling layer 212 includes two layers (i.e., the upper layer 212a and the lower layer 212b), as illustrated in FIG. 2, the upper layer 212a may have a lower refractive index than the refractive index of the first electrode 231 and the lower layer 212b may have a higher refractive index than the refractive index of the upper layer 212a. If the multi-layered light resonance controlling layer 212 is constructed as described above, the light resonance controlling layer 212 may be arranged between any other layers.

The light resonance layer 212 includes alternating a high reflective index layer and a low reflective index layer, producing light resonance within the light resonance controlling layer 212 for amplifying and emitting the light to the outside. The greater the difference between the refractive index of the high reflective index layer and the refractive index of the low reflective index layer, the greater the possibility for light resonance to occur. High refractive index layers of the light resonance controlling layer 212 may be made of a sol gel material in which particles of $SiN_x$, $TiO_2$, $Nb_2O_5$, $Ta_2O_x$, or the like with a refractive index of about 1.5 are dispersed. Low refractive index layers of the light resonance controlling layer 212 may be made of materials such as silicate matrix, methylsiloxanes polyer, siloxane, or Ti—O—Si, polymers such as acrylic polymer or epoxy polymer, oxides such as $SiO_2$, $HfO_x$, or $Al_2O_3$, or impurities such as MgF or CaF with an refractive index of about 1.5.

For the active matrix EL display device of the present embodiment, the emissive layer included in the intermediate layer 233 emits light of a single wavelength, and does not emit red, green, and blue light. To facilitate the manufacturing of the active matrix EL display device, the thickness of the light resonance controlling layer 212 is set so that single-wavelength light may be amplified, and the amplified light is transmitted through the light resonance controlling layer 212 to display a full color image. As a result, a manufacturing process of the EL display device according to the present embodiment may be simplified, manufacturing costs may be reduced, and the production yield of the EL display device may be improved.

The light resonance controlling layer 212 may be arranged in correspondence with each sub-pixel or pixel, or arranged over all the pixels as a single layer.

Figure 3:
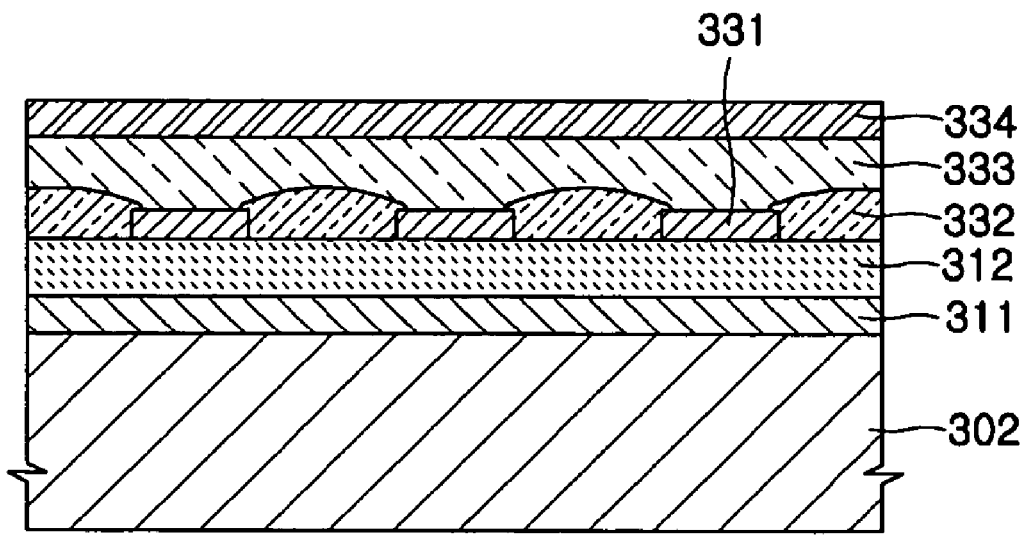
FIG. 3 is a schematic cross-sectional view of an EL display device according to a third embodiment of the present invention.

FIG. 3 is a schematic cross-sectional view of a passive matrix EL display device according to a third embodiment of the present invention.

Referring to FIG. 3, a first electrode 331 is arranged above a substrate 302, a second electrode 334 facing the first electrode 331 is arranged above the first electrode 331, and an intermediate layer 333 including an emissive layer is arranged between the first electrode 331 and the second electrode 334. A buffer layer (not shown) made of, for example, $SiO_2$ may be arranged on the substrate 302 to maintain a smooth surface of the substrate 302 and to prevent penetration of impurities.

A color converting layer 311 is arranged between the substrate 302 and the first electrode 331, or arranged on the second electrode 334. In the EL display device of the present embodiment, a color converting layer 311 is arranged between the substrate 302 and the first electrode 331. The EL display device is a bottom emission EL display device in which light emitted from the emissive layer included in the intermediate layer 333 is emitted to the outside via the substrate 302.

A light resonance controlling layer 312 is arranged between the emissive layer included in the intermediate layer 333 and the color converting layer 311. In the EL display device according to the present embodiment, the light resonance controlling layer 312 is arranged on and substantially parallel to a surface of the color converting layer 311 and the intermediate layer 333 which includes the emissive layer, as illustrated in FIG. 3. Many layers may be arranged between the emissive layer included in the intermediate layer 333 and the color converting layer 311, and the light resonance layer 312 may be arranged between any of those layers.

The emissive layer included in the intermediate layer 333 is a light emitting layer which emits light of a single color, and the color converting layer 311 converts the light emitted from the emissive layer into a color of light selected from the group consisting of red, green or blue light. The emissive layer included in the intermediate layer 333 may emit blue light. In this case, the color converting layer 311 may convert the blue light into red or green light or transmit the blue light without a color conversion.

The EL display device according to the present embodiment differs from the active matrix EL display device according to the first embodiment in that the EL display device according to the present embodiment is a passive matrix EL display device. In the first embodiment, the at least one TFT is formed in the EL display device according to the first embodiment and the emission of each sub-pixel is controlled using each TFT. However, in the EL display device of the present embodiment, emission of light at each sub-pixel is controlled by the first electrode 331 and the second electrode 334 arranged in a predetermined pattern, for example, a striped pattern.

In the EL display device according to the present embodiment, the first electrode 331 is arranged above the substrate 302 in a predetermined pattern, for example, stripes. The intermediate layer 333 including the emissive layer and the second electrode 334 are sequentially arranged on top of the first electrode 331. An insulating layer 332 may be further arranged between the stripes of the first electrode 331 pattern, and the second electrode 334 may be arranged in a pattern perpendicular to the stripes of the first electrode 331. Although not illustrated in FIG. 3, a separate insulating layer may be further formed in a pattern crossing the first electrode 331 perpendicular to the pattern of the second electrode 334. In the EL display device described above, the structures and materials of the first electrode 331, the second electrode 334, and the intermediate layer 333 are the same as described in the previous embodiment.

The light resonance controlling layer 312 in the EL display device of the present embodiment, having the structure described above, has a single layered structure. The refractive index of the light resonance controlling layer 312 is greater than the refractive indexes of the layer arranged on the top surface of the light resonance controlling layer 312 and the layer arranged on the bottom surface of the light resonance controlling layer 312. In the case of the EL display device of the present embodiment, the layer arranged on the top surface of the light resonance controlling layer 312 is the first electrode 331 or the insulating layer 332 and the layer formed on the bottom surface of the light resonance controlling layer 312 is the color converting layer 311. The light resonance controlling layer 312 may be arranged between other layers besides the first electrode 331 and the color converting layer 311.

In the above-described structure, the refractive index of the light resonance controlling layer 312 is greater than the refractive index of the first electrode 331 or the insulating layer 332 arranged on the top surface of the light resonance controlling layer 312 but is less than the refractive index of the color converting layer 311 arranged on the bottom surface of the light resonance controlling layer 312. Therefore, as described above, light output from the emissive layer included in the intermediate layer 333 is amplified and emitted to the outside, increasing external light coupling efficiency and brightness of the EL display device. The light resonance controlling layer 312 is made of the same materials as those described in the previous embodiments.

Similar to the active matrix EL display device according to the first embodiment, the emissive layer included in the intermediate layer 333 emits light of a single wavelength, and does not emit red, green, and blue light. A separate color converting layer (not shown) is provided to convert the color of the light emitted from the emissive layer. As a result, the thickness of the light resonance controlling layer may be set so that the single wavelength light may be amplified. A manufacturing process of the EL display device according to the present embodiment is simplified, manufacturing costs are reduced, and the production yield of the EL display device may be improved.

The light resonance controlling layer 312 may be arranged in correspondence with each sub-pixel or each pixel, or may be arranged over all the pixels as a single layer.

Figure 4:
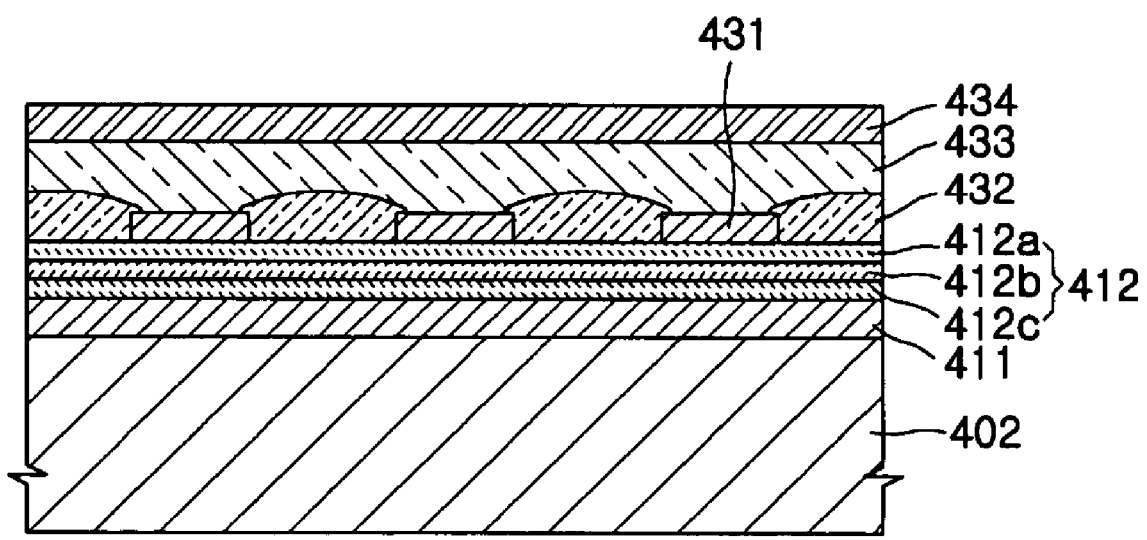
FIG. 4 is a schematic cross-sectional view of an EL display device according to a fourth embodiment of the present invention.

FIG. 4 is a schematic cross-sectional view of an EL display device according to a fourth embodiment of the present invention.

Referring to FIG. 4, a first electrode 431 is arranged above a substrate 402, a second electrode 434 is arranged above and substantially parallel to the first electrode 431, and an intermediate layer 433 including an emissive layer is arranged between the first electrode 431 and the second electrode 434. A buffer layer (not shown) made of, for example, $SiO_2$ may be arranged on the substrate 402 to maintain a smooth surface of the substrate 402 and to prevent penetration of impurities.

The EL display device of the present embodiment differs from the EL display device of the third embodiment because a light resonance controlling layer 412 in the present embodiment does not have a single layer structure, but has a multi-layered structure having an upper layer 412a, an intermediate layer 412b, and a lower layer 412c. Referring to FIG. 4, the light resonance controlling layer 412 includes three layers but may include more than three layers. The light resonance controlling layer 412 may be formed of alternating layers having a high refractive index and low refractive index. If the light resonance controlling layer 412 includes three layers, as illustrated in FIG. 4, the refractive index of the upper layer 412a is less than the refractive index of a first electrode 431 or an insulating layer 432 arranged on top of the upper layer 412a; the refractive index of the intermediate layer 412b arranged on a bottom surface of the upper layer 412a is greater than the refractive index of the upper layer 412a; and the refractive index of the lower layer 412c is less than the refractive index of the intermediate layer 412b and the refractive index of a color converting layer 411 arranged on a bottom surface of the lower layer 412c. The light resonance controlling layer 412 of the multi-layered structure may be arranged between other layers besides the color converting layer 411 and the first electrode 431 as described above.

As described above, a single-layered light resonance controlling layer may be used. The greater the difference between the refractive index of the light resonance controlling layer 412 and the refractive index of layers above and below the light resonance controlling layer 412, the greater the possibility for light resonance to occur. Therefore, if it is difficult to use materials to achieve this effect, a multi-layered light resonance controlling layer structure where layers having a high refractive index and layers having a low refractive index are alternatively arranged may be used to achieve the same effect.

Also, in the active matrix EL display device according to the present embodiment, an emissive layer included in an intermediate layer 433 emits light of a single wavelength, and does not emit red, green, and blue light. The thickness of the light resonance controlling layer 412 may be set so that the single wavelength light may be amplified and transmitted through the color converting layer 411 to display a full color image. As a result, a manufacturing process of the EL display device according to the present embodiment is simplified, manufacturing costs for the EL display device are reduced, and production yield of the EL display device may be improved.

Figure 5:
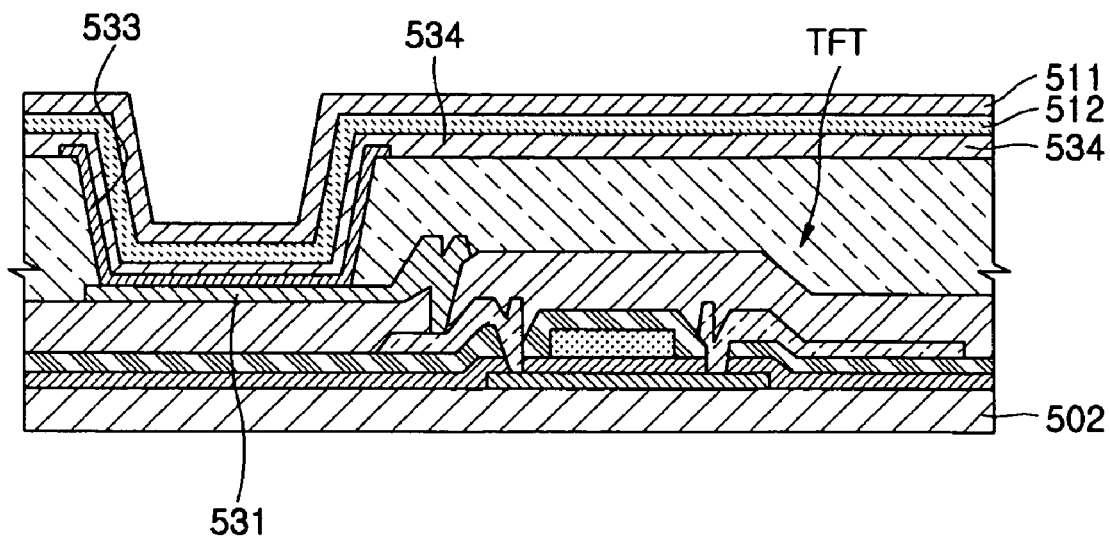
FIG. 5 is a schematic cross-sectional view of an EL display device according to a fifth embodiment of the present invention.

FIG. 5 is a schematic cross-sectional view of an EL display device according to a fifth embodiment of the present invention. The EL display device of the present embodiment differs from the EL display device of the first embodiment in that the EL display device of the first embodiment includes the color converting layer 112 arranged between the substrate 102 and the first electrode 131 and is a bottom emission EL display device in which the light emitted from the emission layer included in the intermediate layer 133 is emitted to the outside via the substrate 102. However, the EL display device of the present embodiment includes a color converting layer 511 which is disposed above a second electrode 534 and is a top emission EL display device in which light emitted from an emission layer included in an intermediate layer 533 is emitted to the outside via a substrate 502.

Therefore, in the EL display device of the present embodiment, a first electrode 531 is a reflective electrode and the second electrode 534 is a transparent electrode. Thus, the first electrode 531 may be arranged by arranging a reflective layer using Ag, Mg, Al, Pt, Pd, Au, Ni, Nd, Ir, or Cr and a compound of Ag, Mg, Al, Pt, Pd, Au, Ni, Nd, Ir, or Cr and then forming ITO, IZO, ZnO, or $In_2O_3$ on the resulting structure. The first electrode 531 may be arranged to correspond with the sub-pixels. The second electrode 534 is made by depositing Li, Ca, LiF/Ca, LiF/Al, Al, or Mg and compounds of Li, Ca, LiF/Ca, LiF/Al, Al, or Mg on the intermediate layer 533 and then arranging a supplementary electrode layer or a bus electrode line using materials for arranging a transparent electrode such as ITO, IZO, ZnO, or $In_2O_3$ on the resulting structure. The second electrode 534 may be arranged in correspondence with each sub-pixel or may be arranged over the entire surface of the substrate 502. Top emission EL display devices of other embodiments described below may be structured as described above or may be structured in various other ways.

A light resonance controlling layer 512 is disposed between the emissive layer included in the intermediate layer 533 and a color converting layer 511. In the EL display device of the present embodiment, the light resonance controlling layer 512 is formed on a surface of the color converting layer 511 facing the intermediate layer 533 including the emissive layer, as illustrated in FIG. 5. There may be various layers formed between the emissive layer included in the intermediate layer 533 and the color converting layer 511, and the light resonance controlling layer 512 may be disposed between any of those layers.

As described above, the emissive layer included in the intermediate layer 533 may emit monochrome light and the color converting layer 511 converts the light emitted from the emissive layer into a color of light selected from the group consisting of red, green, or blue light. The emissive layer included in the intermediate layer 533 may emit blue light. In this case, the color converting layer 511 may convert the blue light into red or green light or may transmit the blue light without a color conversion.

A passive matrix EL display device as described above, which is a top emission EL display device, may improve external light coupling efficiency and brightness using the light resonance controlling layer 512. Also, a manufacturing process of the EL display device of the present embodiment may be simplified, manufacturing costs of the EL display device may be reduced, and production yield of the EL display device may be improved by including an emissive layer which emits monochrome light, and using the color converting layer 511.

Figure 6:
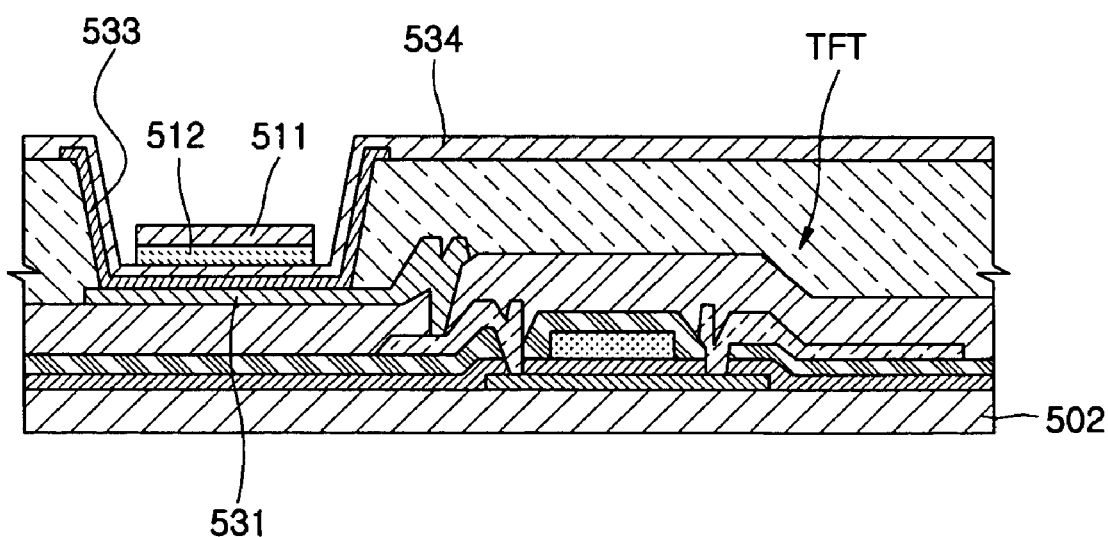
FIG. 6 is a schematic cross-sectional view of a modification of the EL display device depicted in FIG. 5.
Figure 7:
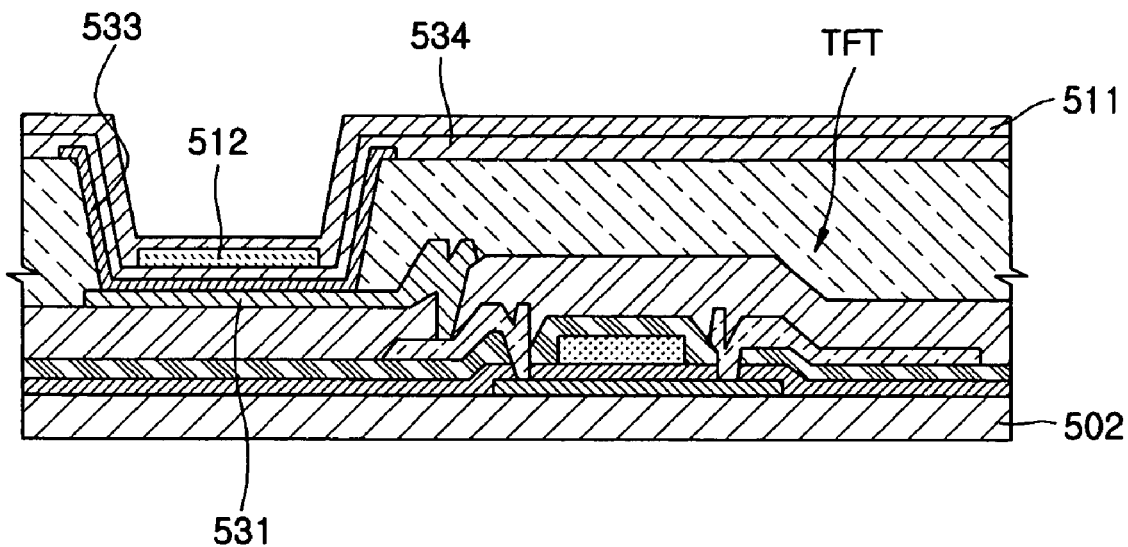
FIG. 7 is a schematic cross-sectional view of another modification of the EL display device depicted in FIG. 5.
Figure 8:
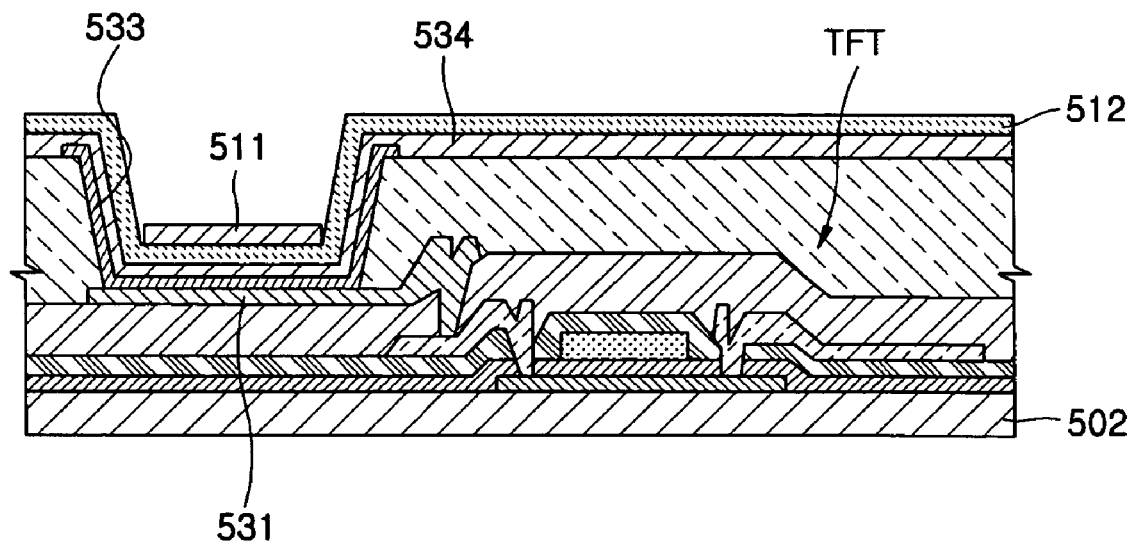
FIG. 8 is a schematic cross-sectional view of another modification of the EL display device depicted in FIG. 5.

As illustrated in FIG. 5, the light resonance controlling layer 512 and the color converting layer 511 are arranged over the entire surface of the substrate 502. However, the light resonance controlling layer 512 and the color converting layer 511 may be patterned to correspond to each sub-pixel, as illustrated in FIG. 6, or the light resonance controlling layer 512 may be patterned to correspond to each sub-pixel while the color converting layer 511 is arranged over the entire area of the substrate 502, as illustrated in FIG. 7. Alternatively, the light resonance controlling layer 512 may be disposed over the entire surface of the substrate 502 while the color converting layer 511 is patterned to correspond to each sub-pixel, as illustrated in FIG. 8.

Figure 9:
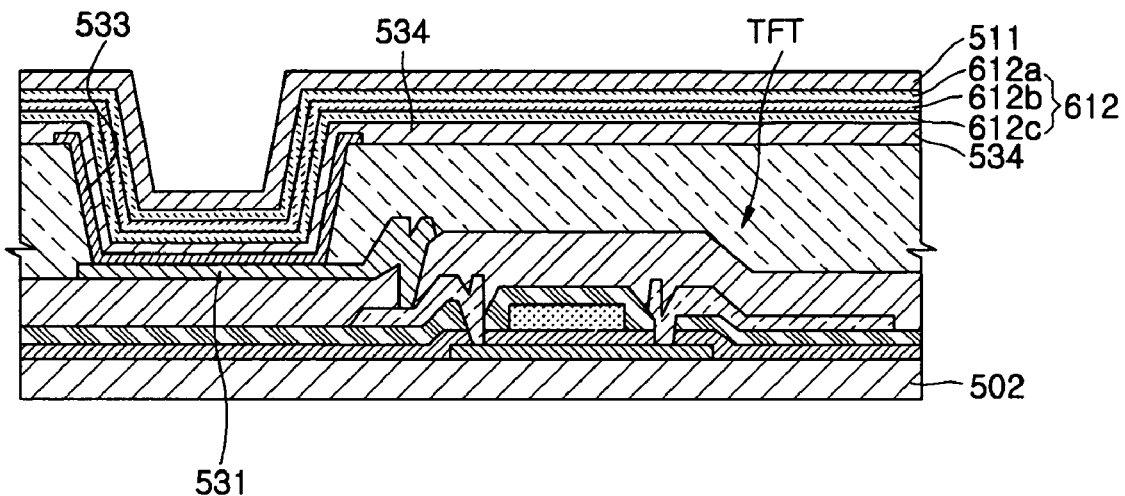
FIG. 9 is a schematic cross-sectional view of an EL display device according to a sixth embodiment of the present invention.
Figure 10:
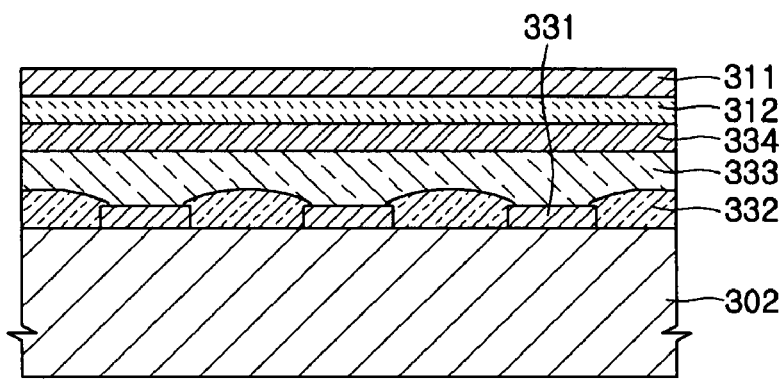
FIG. 10 is a schematic cross-sectional view of an EL display device according to a seventh embodiment of the present invention.
Figure 11:
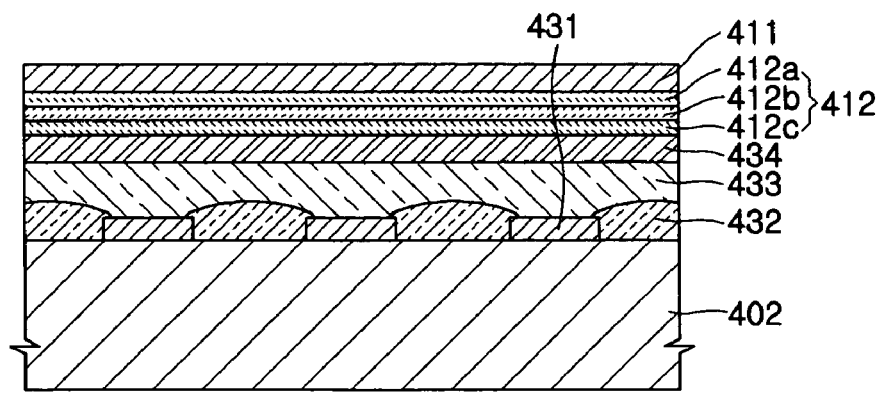
FIG. 11 is a schematic cross-sectional view of an EL display device according to an eighth embodiment of the present invention.

As illustrated in FIG. 9, a light resonance controlling layer 612 of a top emission, active matrix EL display device according to a sixth embodiment of the present invention may be structured to include a plurality of layers in which layers with a high refractive index and layers with a low refractive index are alternately arranged, similarly to the bottom emission, active matrix EL display device according to the second embodiment. Also, the same light resonance controlling layer structures may be applied to top emission, passive matrix EL display devices illustrated in FIG. 10 and FIG. 11. Although not illustrated in the drawings, the same light resonance controlling layer structures may be applied to a dual emission EL display device in which light emitted from an emissive layer is emitted to the outside via both sides of the emissive layer.

According to an EL display device of the present invention, the following may be achieved:

First, the external light coupling efficiency of light emitted from an emissive layer is increased and brightness of the EL display device may be improved by adjusting the refractive index of a single layered light resonance controlling layer higher or lower than the refractive index of layer arranged above or below the light resonance controlling layer.

Second, the manufacturing of the light resonance controlling layer may be facilitated by including a multiple layered light resonance controlling layer in which layers with low refractive index and layers with high refractive index are alternately arranged.

Third, the emissive layer included with the light resonance controlling layer emits light with a single wavelength, a full color display device is configured using a color converting layer, and the light resonance controlling layer is arranged between the emissive layer and the color converting layer. Thus, the EL display device may be easily manufactured, manufacturing costs of the EL display device are reduced, and the production yield of the EL display device is increased.

It will be apparent to those skilled in the art that various modifications and variations may be made in the present invention without departing from the spirit or scope of the invention. Thus, it is intended that the present invention cover the modifications and variations of this invention provided they come within the scope of the appended claims and their equivalents.

What is claimed is:

1. An electroluminescence luminescence (EL) display device, comprising:
   a substrate;
   a first electrode arranged above the substrate;
   a second electrode arranged above the first electrode, the second electrode facing the first electrode;
   an intermediate layer arranged between the first and second electrodes, and including an emissive layer;
   a color converting layer arranged above the second electrode;
   a light resonance controlling layer arranged between the emissive layer and the color converting layer; and
   a pixel defining layer having walls defining an opening, wherein the color converting layer is enclosed by the walls,
   wherein the color converting layer does not contact the second electrode,
   wherein the color converting layer contacts the light resonance controlling layer, and
   wherein the first electrode extends beyond the color converting layer.

2. The EL display device of claim 1, wherein the emissive layer emits blue light.

3. The EL display device of claim 1, wherein the color converting layer converts light emitted from the emissive layer into one of a light color selected from the group consisting of red, green, and blue light.

4. The EL display device of claim 1, wherein the light resonance controlling layer is a single layer.

5. The EL display device of claim 4, wherein a refractive index of the light resonance controlling layer is less than refractive indexes of layers arranged on the light resonance controlling layer and below the light resonance controlling layer.

6. The EL display device of claim 1, wherein the light resonance controlling layer comprises at least two layers.

7. The EL display device of claim 6, wherein the light resonance controlling layer comprises alternating layers having a low refractive index and layers having a high refractive index.

8. The EL display device of claim 1, wherein the light resonance controlling layer is arranged between the second electrode and the color converting layer.

9. The EL display device of claim 1, further comprising a second color converting layer arranged between the substrate and the first electrode, and a second light resonance controlling layer arranged between the emissive layer and the second color converting layer.

10. An electroluminescence luminescence (EL) display device, comprising:
    a substrate;
    a gate electrode arranged above the substrate;
    a first electrode arranged above the substrate;
    a second electrode arranged above the first electrode, the second electrode facing the first electrode;
    an intermediate layer arranged between the first and second electrodes, and including an emissive layer;
    a color converting layer arranged between the substrate and the gate electrode; and
    a light resonance controlling layer arranged between the emissive layer and the color converting layer,
    wherein the color converting layer is continuously arranged across the entire substrate.

11. The EL display device of claim 10, wherein the emissive layer emits blue light.

12. The EL display device of claim 10, wherein the color converting layer converts light emitted from the emissive layer into one of a light color selected from the group consisting of red, green, and blue light.

13. The EL display device of claim 10, wherein the light resonance controlling layer is a single layer.

14. The EL display device of claim 13, wherein a refractive index of the light resonance controlling layer is less than refractive indexes of layers arranged on the light resonance controlling layer and below the light resonance controlling layer.

15. The EL display device of claim 10, wherein the light resonance controlling layer comprises at least two layers.

16. The EL display device of claim 15, wherein the light resonance controlling layer comprises alternating layers having a low refractive index and layers having a high refractive index.

17. The EL display device of claim 1, wherein the light resonance controlling layer comprises a layer comprising a sol gel material in which high refractive particles are dispersed.

18. The EL display device of claim 10, wherein the light resonance controlling layer contacts the color converting layer.

19. The EL display device of claim 10, wherein the light resonance controlling layer comprises a layer comprising a sol gel material in which high refractive particles are dispersed.

20. An electroluminescence luminescence (EL) display device, comprising:
    a substrate;
    a plurality of first electrodes arranged above the substrate;
    a second electrode arranged above the first electrodes, the second electrode facing the first electrodes;
    an intermediate layer arranged between each first electrode and the second electrode, and including an emissive layer;
    a color converting layer arranged above the second electrode and continuously arranged across the entire substrate; and
    a light resonance controlling layer arranged between the emissive layer and the color converting layer,
    wherein the light resonance controlling layer contacts the second electrode.

21. An electroluminescence luminescence (EL) display device, comprising:
    a substrate;
    a plurality of first electrodes arranged above the substrate;
    a second electrode arranged above the first electrodes, the second electrode facing the first electrodes;
    an intermediate layer arranged between each first electrode and the second electrode, and including an emissive layer;
    a color converting layer arranged between the substrate and the first electrodes; and
    a light resonance controlling layer arranged between the emissive layer and the color converting layer,
    wherein the light resonance controlling layer contacts the first electrodes, and
    wherein the color converting layer is continuously arranged across the entire substrate.

* * * * *